United States Patent
Zhang et al.

(10) Patent No.: US 9,837,386 B2
(45) Date of Patent: Dec. 5, 2017

(54) POWER DEVICE AND PREPARATION METHOD THEREOF

(71) Applicant: Alpha and Omega Semiconductor Incorporated, Sunnyvale, CA (US)

(72) Inventors: Xiaotian Zhang, San Jose, CA (US); Shekar Mallikarjunaswamy, San Jose, CA (US); Zhiqiang Niu, Santa Clara, CA (US); Cheow Khoon Oh, Hacienda (SG); Yueh-Se Ho, Sunnyvale, CA (US)

(73) Assignee: ALPHA AND OMEGA SEMICONDUCTOR INCORPORATED, Sunnyvale, CA (US)

( * ) Notice: Subject to any disclaimer, the term of this patent is extended or adjusted under 35 U.S.C. 154(b) by 0 days.

(21) Appl. No.: 14/993,971

(22) Filed: Jan. 12, 2016

(65) Prior Publication Data

US 2017/0200705 A1    Jul. 13, 2017

(51) Int. Cl.
*H01L 25/07* (2006.01)
*H01L 23/49* (2006.01)
(Continued)

(52) U.S. Cl.
CPC ...... *H01L 25/072* (2013.01); *H01L 23/49811* (2013.01); *H01L 23/49827* (2013.01); *H01L 23/49838* (2013.01); *H01L 24/17* (2013.01); *H01L 24/40* (2013.01); *H01L 24/73* (2013.01); *H01L 29/7827* (2013.01);
(Continued)

(58) Field of Classification Search
CPC ......... H01L 23/49811; H01L 23/49827; H01L 23/49838; H01L 23/49844; H01L 24/17; H01L 24/40; H01L 24/41; H01L 24/42; H01L 24/73; H01L 25/071; H01L 25/072; H01L 29/7827; H01L 2224/16225; H01L 2224/4005; H01L 2224/40137; H01L 2224/73255; H01L 2924/13091; H01L 2924/14252; H02M 3/158
USPC ............... 257/291, 675, 676, 691, E21.499, 257/E23.032, E23.051; 363/10, 147; 439/83
See application file for complete search history.

(56) References Cited

U.S. PATENT DOCUMENTS

| | | | |
|---|---|---|---|
| 8,169,081 B1 * | 5/2012 | Jergovic | H01L 23/4824 257/343 |
| 8,669,650 B2 | 3/2014 | Zhang et al. | |

(Continued)

*Primary Examiner* — Johannes P Mondt
(74) *Attorney, Agent, or Firm* — Chen-Chi Lin

(57) ABSTRACT

A power conversion device including a low-side MOSFET, a high-side MOSFET and an integrated control IC chip is disclosed. The power conversion device further includes a substrate comprising a first mounting area having a first group of welding discs and a second mounting area having a second group of welding discs; a first chip flipped and attached to the first mounting area; a second chip flipped and attached to the second mounting area; a metal clip; and a molding body covering a front surface of the substrate, the first chip, the second chip and the metal clip. Metal pads on a front side of the first chip is attached to the first group of welding discs. Metal pads on a front side of the second chip is attached to the second group of welding discs. The metal clip connects a connection pad to a back metal layer of the first chip.

19 Claims, 11 Drawing Sheets

(51) Int. Cl.

| | |
|---|---|
| *H02M 3/158* | (2006.01) |
| *H01L 29/78* | (2006.01) |
| *H01L 23/498* | (2006.01) |
| *H01L 23/00* | (2006.01) |

(52) U.S. Cl.
CPC ... *H02M 3/158* (2013.01); *H01L 2224/16225* (2013.01); *H01L 2224/4005* (2013.01); *H01L 2224/40137* (2013.01); *H01L 2224/73255* (2013.01); *H01L 2924/13091* (2013.01); *H01L 2924/14252* (2013.01)

(56) References Cited

U.S. PATENT DOCUMENTS

| | | | |
|---|---|---|---|
| 8,981,539 B2 * | 3/2015 | Xue | H01L 23/492 |
| | | | 257/672 |
| 9,054,091 B2 | 6/2015 | Yilmaz et al. | |
| 2007/0164428 A1 | 7/2007 | Elbanhawy et al. | |
| 2007/0228999 A1 * | 10/2007 | Kit | H05B 33/0803 |
| | | | 315/291 |
| 2012/0061813 A1 * | 3/2012 | Ho | H01L 23/49524 |
| | | | 257/676 |
| 2014/0167238 A1 | 6/2014 | Jeon et al. | |
| 2015/0001618 A1 | 1/2015 | Hebert | |
| 2015/0380384 A1 * | 12/2015 | Williams | H01L 24/97 |
| | | | 438/112 |

\* cited by examiner

US 9,837,386 B2

POWER DEVICE AND PREPARATION METHOD THEREOF

FIELD OF THE INVENTION

This invention relates generally to a power conversion device. More particularly, the present invention relates to a DC-DC voltage converter. The DC-DC voltage converter includes a low-side (LS) metal oxide semiconductor field-effect transistor (MOSFET), a high-side (HS) MOSFET and a control integrated circuit (IC) chip.

BACKGROUND OF THE INVENTION

In a DC-DC voltage converter, the power consumption of a MOSFET is high. The source terminal or the drain terminal of the MOSFET is required to dissipate heat. Conventionally, part of a lead frame is exposed from a molding body to improve heat dissipation of the MOSFET. For example, as shown in FIG. 6 (same as FIG. 1 of the U.S. Pat. No. 8,981,539), a DC-DC converter 10 includes a HS MOSFET 11, a LS MOSFET 13, and a control chip 12. The control chip 12 outputs a pulse width modulation (PWM) or pulse frequency modulation (PFM) signal to the HS MOSFET 11 and the LS MOSFET 13 and then receives feedback signals. Electrode pads arranged on the HS MOSFET 11 and the LS MOSFET 13 are electrically connected to input/output (I/O) metal pads of the control chip 12 through a plurality of leads. The HS MOSFET 11 and the LS MOSFET 13 are respectively attached to a substrate 21 and a substrate 23. The substrate 21 and the substrate 23 are separated from each other. The source of the HS MOSFET 11 is connected to the substrate 23 through a metal sheet 15. The source of the LS MOSFET 13 is connected to the pin 24 through a metal sheet 16. The control chip 12 is attached to another separated metal substrate 22. The respective bottom surfaces of the metal substrate 21 and the metal substrate 23 are exposed from a bottom surface of a molding body of the DC-DC converter 10 (not shown). The exposed bottom surfaces are used as terminals electrically connected to external circuits for heat dissipation. The disadvantage of the DC-DC converter 10 is that dimensions of metal substrate 21 and the metal substrate 23 are large. Therefore, a device package size of the DC-DC converter 10 is large and the corresponding fabrication cost is high.

US patent application publication US20120061813A1 discloses a DC-DC voltage converter for power conversion. The DC-DC voltage converter includes a HS MOSFET and a LS MOSFET. The HS MOSFET and the LS MOSFET are arranged side by side on a substrate. A control chip is stacked on the HS MOSFET and the LS MOSFET. It requires that a metal contact lead of the HS MOSFET and the LS MOSFET must have a lower loop height to avoid the control chip to contact the metal contact lead. The heat radiating route of the HS MOSFET and the LS MOSFET is blocked by the control chip.

DETAILED DESCRIPTION OF THE INVENTION

Figure 1A:
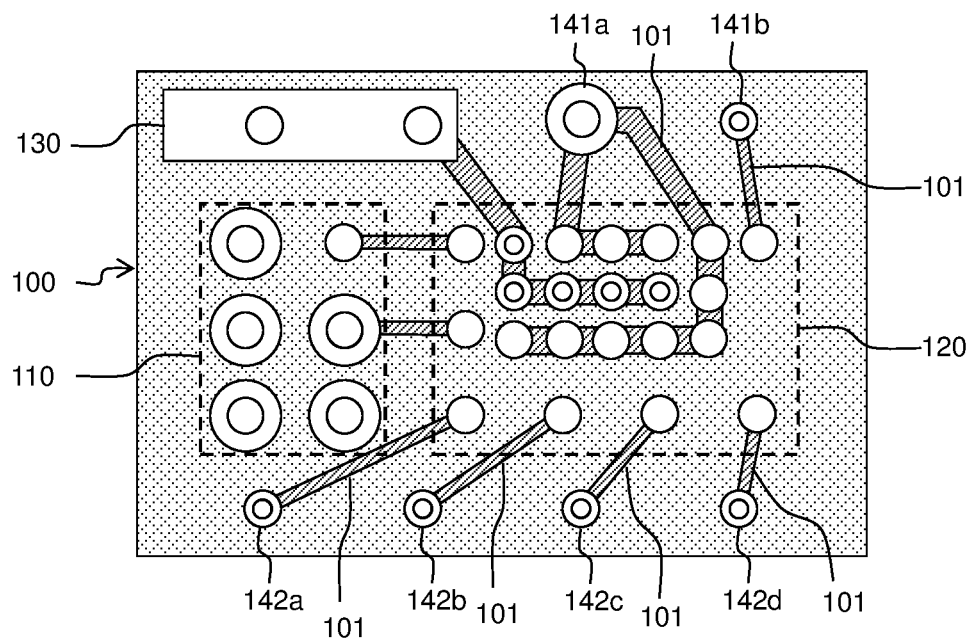
FIG. 1A to FIG. 1D are schematic diagrams illustrating a circuit board in examples of the present disclosure.

FIG. 1A is a schematic diagram of an insulating substrate 100 in examples of the present disclosure. In one example, the substrate 100 is a printed circuit board for electrical connection of electronic parts and components. The substrate 100 includes a first mounting area 110 and a second mounting area 120 for mounting the semiconductor chips. The first mounting area 110 and the second mounting area 120 are close to each other and are arranged side by side on a front surface of the substrate 100.

Figure 1B:
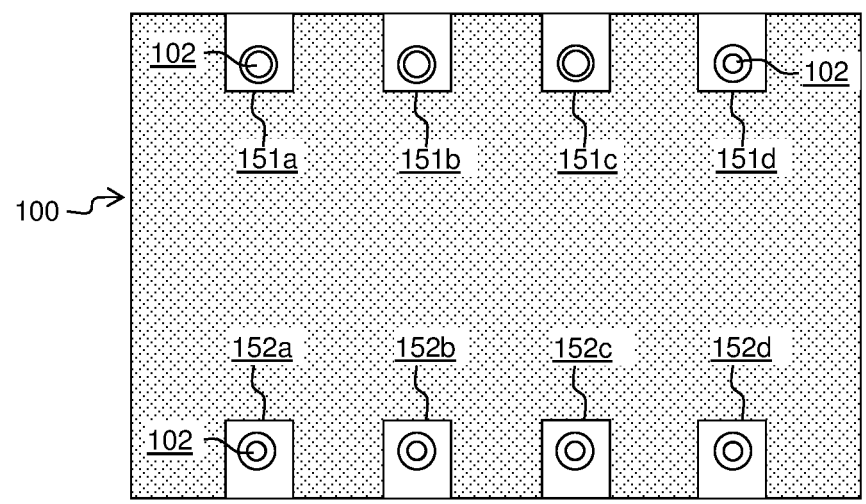

FIG. 1B is another schematic diagram of the substrate 100. The substrate 100 further includes a group of pin pads 151a-151d and another group of pin pads 152a-152d located on a back surface of the substrate 100. Pin pads 151a-151d are located near a top edge of the substrate 100. The other group of pin pads 152a-152d are located near a bottom edge opposite the top edge. In examples of the present disclosure, the pin pads 151a-151d are arranged in a row and the pin pads 152a-152d are arranged in another row.

Figure 1C:
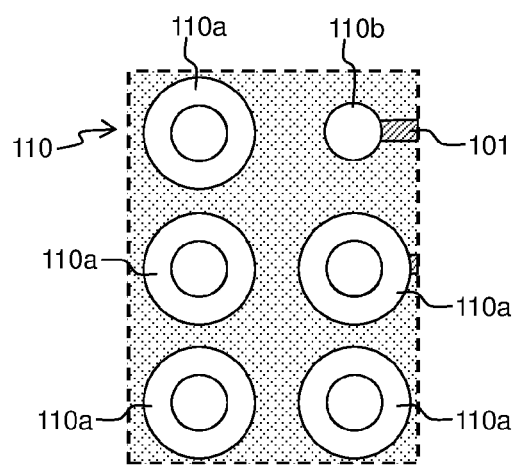
Figure 1D:
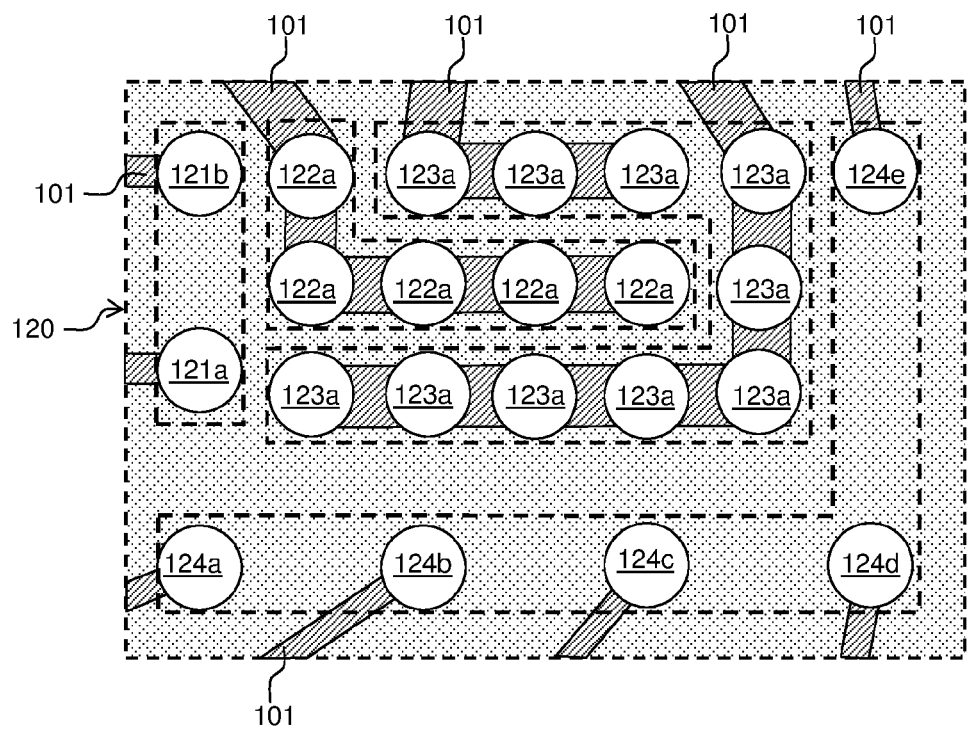

FIG. 1C is a zoomed-in view of the first mounting area 110. FIG. 1D is a zoomed-in view of the second mounting area 120. In FIG. 1C, the first mounting area 110 includes a first set of welding discs 110a and a second set of welding discs 110b. In examples of the present disclosure, the first mounting area 110 includes a plurality of first set of welding discs 110a and only one second set of welding disc 110b. In FIG. 1D, the second mounting area 120 includes a third set of welding discs 121a and 121b, a fourth set of welding discs 124a-124e, a fifth set of welding discs 122a and a sixth set of welding discs 123a. The third set of welding discs 121a-121b are not interconnected. The fourth set of welding discs 124a-124e are not interconnected. The fifth set of welding discs 122a are interconnected through a metal wiring 101 on the front surface of the substrate 100. The sixth set of welding discs 123a is interconnected through another metal wiring 101 on the front surface of the substrate 100.

Referring to FIG. 1A, FIG. 1C and FIG. 1D, the second set of welding disc 110b in the first mounting area 110 is directly interconnected with the third set of welding discs 121b in the second mounting area 120 through the metal wiring 101. One of the first set of welding discs 110a in the first mounting area 110 is directly interconnected with of the third set of welding disc 121a in the second mounting area 120 through another metal wiring 101.

Referring to FIG. 1A, FIG. 1B and FIG. 1D, each welding disc in the fourth set of welding discs 124a-124e is connected to a respective pin pad located on the front surface of the substrate 100 through the wiring 101. For example, a fourth set of welding disc 124a (FIG. 1D) is connected to one welding disc 142a located on the front surface of the substrate 100. The welding disc 142a is aligned with and overlapped with the pin pad 152a (FIG. 1B) on the back surface of the substrate 100. A through hole penetrating through the thickness of the substrate 100 is arranged between the welding disc 142a on the front surface and the pin pad 152a on the back surface of the substrate 100. The through hole is lined and filled with a metal material forming the interconnecting via 102. Therefore, the welding disc 142a on the front surface of the substrate 100 is electrically connected with the pin pad 152a on the back surface. Similarly, one fourth set of welding disc 124b (FIG. 1D) is connected to one welding disc 142b (FIG. 1A) located on the front surface of the substrate 100. The welding disc 142b is aligned with the pin pad 152b (FIG. 1B). Therefore, the fourth set of welding disc 124b and the pin pad 152b are electrically connected by another interconnecting via 102. The fourth set of welding disc 124c (FIG. 1D) is connected to one welding disc 142c (FIG. 1A) located on the front surface of the substrate 100. The welding disc 142c is aligned with a pin pad 152c on the back surface of the substrate 100. Therefore, the welding disc 142c is electrically connected to the pin pad 152c by yet another interconnecting via 102. The fourth set of welding disc 124d (FIG. 1D) is connected to one welding disc 142d (FIG. 1A) located on the front surface of the substrate 100. The welding disc 142d is aligned with the pin pad 152d (FIG. 1B) on the back surface of the substrate 100. Therefore, the fourth set of welding disc 124d is electrically connected with the pin pad 152d by still another interconnecting via 102. One fourth set of welding disc 124e (FIG. 1D) is connected to one welding disc 141b (FIG. 1A) located on the front surface of the substrate 100 through the wiring 101. The welding disc 141b and the pin pad 151d (FIG. 1B) are aligned and are electrically connected by yet still another interconnecting via 102. Therefore, the fourth set of welding disc 124e is electrically connected to the pin pad 151d.

Referring to FIG. 1A to FIG. 1D, the fifth set of welding discs 122a are electrically connected together. The fifth set of welding discs 122a are also electrically connected to a metal connection pad 130 on the front surface of the substrate 100 through the wiring 101. The metal connection pad 130 is near the first mounting area 110. The connection pad 130 is preferably in a shape of long strip. The welding disc 141a and the welding disc 141b, on the front surface of the substrate 100, are arranged along a direction of an extended line of the connection pad 130. The connection pad 130, the welding disc 141a and the welding disc 141b are located near the top edge of the substrate 100 and are overlapped with the first row of pin pads 151a-151d (FIG. 1B). The welding discs 142a-142d are located near the bottom edge of the substrate 100 and are overlapped with the second row of pin pads 152a-152d (FIG. 1B). As mentioned above, each of the group of welding discs 142a-142d on the front surface of the substrate 100 are aligned with and are overlapped with a respective pin pad of the row of pin pads 152a-152d on the back surface of the substrate 100. The connection pad 130 (FIG. 1A) on the front surface of the substrate 100 is aligned with and is overlapped with two pin pads 151a and 151b (FIG. 1B) on the back surface of the substrate 100. The connection pad 130 is electrically connected to the two pin pads 151a and 151b by interconnecting vias 102 formed in the through holes penetrating through the connection pad 130 and the two pin pads 151a and 151b. Therefore, the fifth set of welding discs 122a and the connection pad 130 are electrically connected to the two pin pads 151a and 151b (FIG. 1B).

Referring to FIG. 1A to FIG. 1D, all the sixth set of welding discs 123a are interconnected with each other through the metal wiring 101 on the front surface of the substrate 100 and are further connected to one welding disc 141a through the wiring 101. The welding disc 141a on the front surface of the substrate 100 (FIG. 1A) is aligned with and is overlapped with one pin pad 151c on the back surface of the substrate 100 (FIG. 1B). The welding disc 141a and the pin pad 151c are electrically connected by an interconnecting via 102 formed in the through hole penetrating through the welding disc 141a and the pin pad 151c. All the sixth set of welding discs 123a are electrically connected with the pin pad 151c. In examples of the present disclosure, the metal pin pads on the back surface of the substrate 100 are respectively electrically connected to all metal welding discs on the front surface of the substrate 100 or the metal connection pad 130.

Figure 2A:
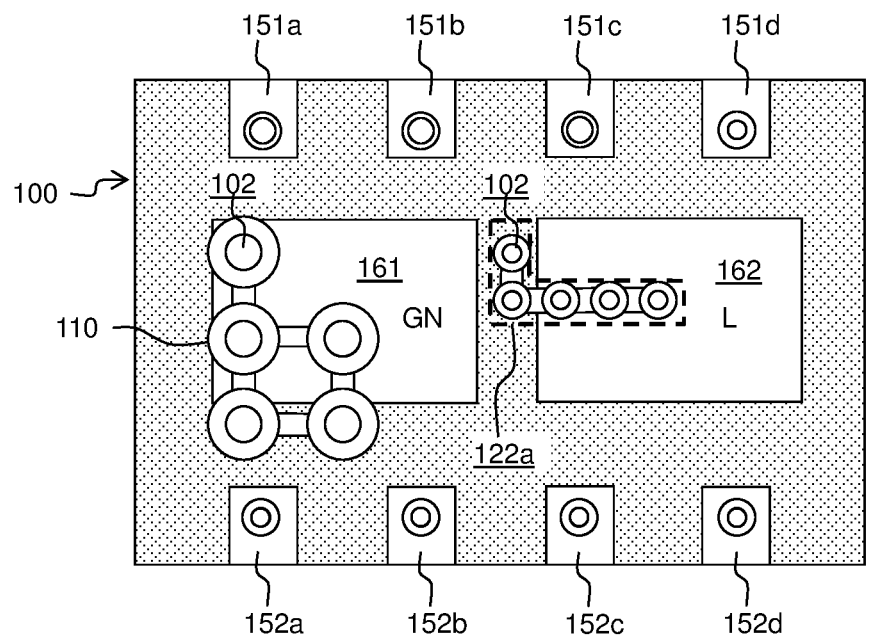
FIG. 2A to FIG. 2I are schematic diagrams illustrating a process of mounting a chip on a front surface the circuit board.

Another example is shown in FIG. 2A, which is slightly different from FIG. 1B. The first row of pin pads 151a-151d and the second row of pin pads 152a-152d are arranged in the edge areas of the back surface of the substrate 100. A first metal welding pad 161 and a second metal welding pad 162 are arranged in a center area of the back surface of the substrate 100. The first metal welding pad 161 and the second metal welding pad 162 are side by side and are separated from each other. Referring to FIG. 1A and FIG. 2A, the first set of welding discs 110a formed in the first mounting area 110 on the front surface of the substrate 100 are aligned with and are overlapped with the first metal welding pad 161 on the back surface of the substrate 100. The through holes are penetrating through the first set of welding discs and the first metal welding pad 161 with the interconnecting via 102 formed in the through hole. Therefore, the first set of welding discs 110a and the first metal welding pad 161 are electrically connected. However, the second set of welding discs 110b arranged in the first mounting area 110 is not electrically connected to the first metal welding pad 161. Referring to FIG. 1D and FIG. 2A, the fifth set of welding discs 122a arranged in the second mounting area 120 are aligned with and are overlapped with the second metal welding pad 162 with the through holes penetrating through the welding discs and the second metal welding pad 162. The through holes are filled with interconnecting vias 102. Therefore, the fifth set of welding discs 122a are electrically connected to the second metal welding pad 162.

Figure 2B:
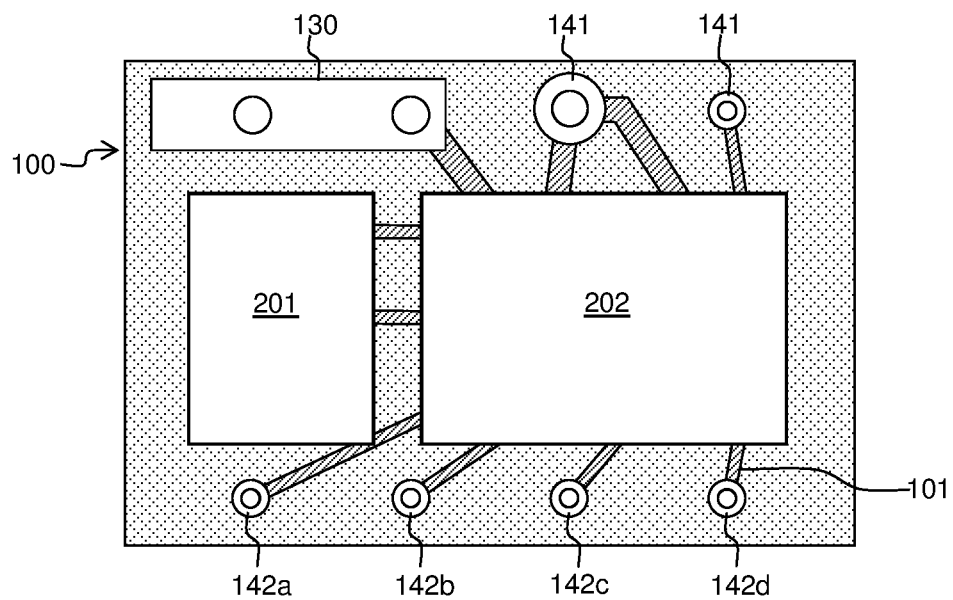

In FIG. 2B, one first semiconductor chip 201 is mounted on the first mounting area 110 and a second semiconductor chip 202 is mounted on the second mounting area 120. The first semiconductor chip 201 and the second semiconductor chip 202 are flipped and attached to the front surface of the substrate 100.

Figure 2C:
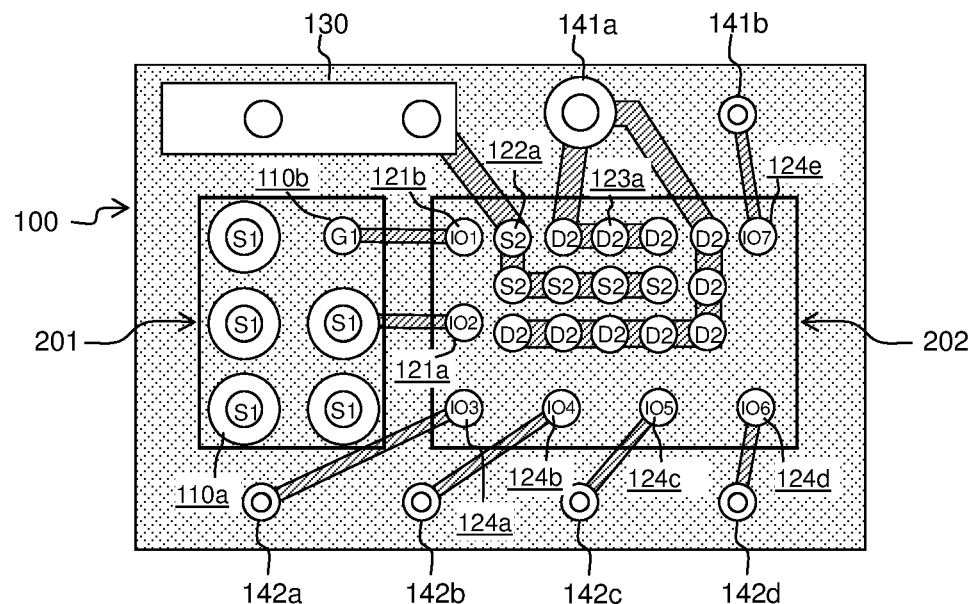

In FIG. 2C, for clarity, the first semiconductor chip 201 and the second semiconductor chip 202 are drawn as transparent to show an alignment mode of the first semiconductor chip 201 and the second semiconductor chip 202 overlapping on the first mounting area 110 and the second mounting area 120. In a conventional DC-DC voltage converter, a LS power MOSFET and a HS power MOSFET are usually connected between a power voltage VIN and a ground terminal GND in serial. A control circuit (IC) controls the on-off of the LS power MOSFET and the HS power MOSFET. In examples of the present disclosure, the first semiconductor chip 201 is the LS power MOSFET and the second semiconductor chip 202 with the IC chip integrated thereon is the HS power MOSFET of the DC-DC converter.

Figure 2D:
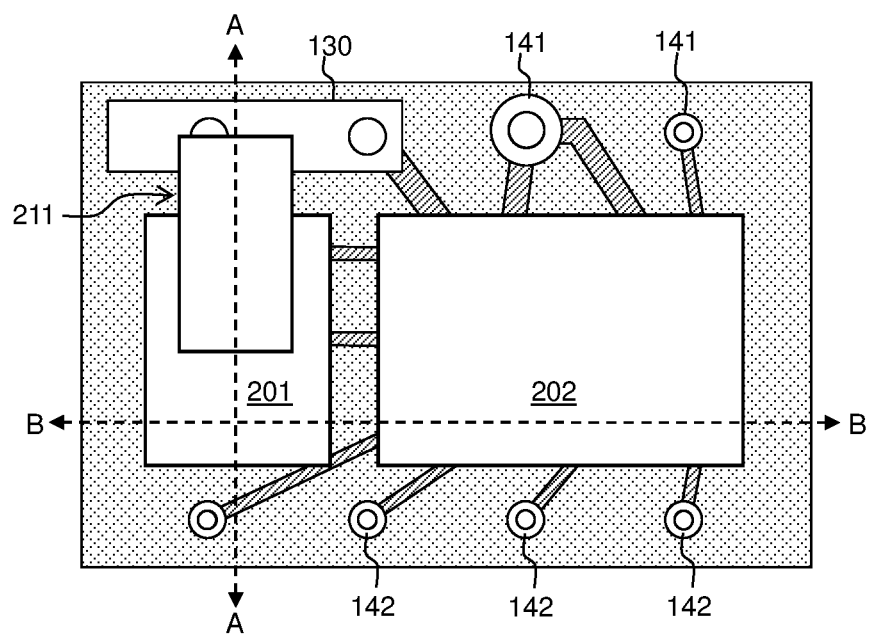
Figure 2E:
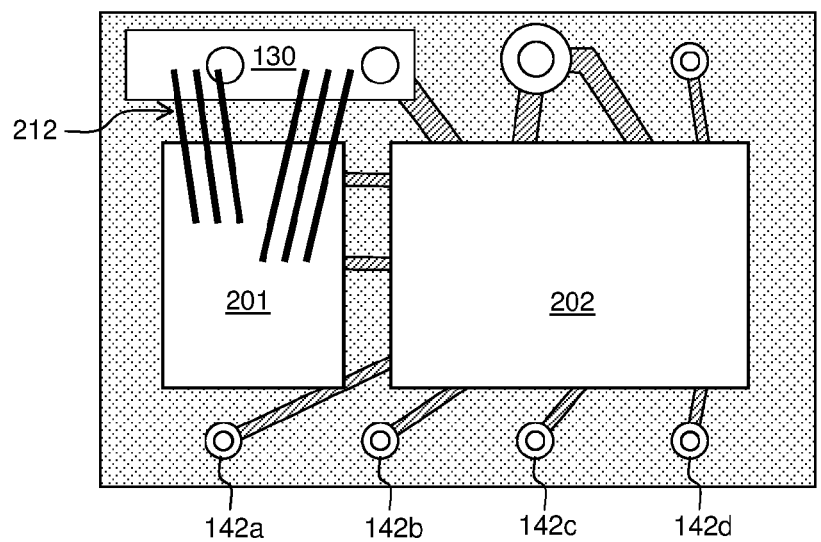

In FIG. 2D, a metal clip 211 is attached to the connection pad 130 and the back metal layer on the back side of the first flipped chip 201. The metal clip 211 electrically connects the connection pad 130 and the back metal of the first flipped chip 201. In examples of the present disclosure, the metal clip 211 can be replaced by the bonding wires 212 as shown in FIG. 2E. In examples of the present disclosure, the metal clip 211 can be replaced by a conductive band or other similar structure.

Figure 2F:
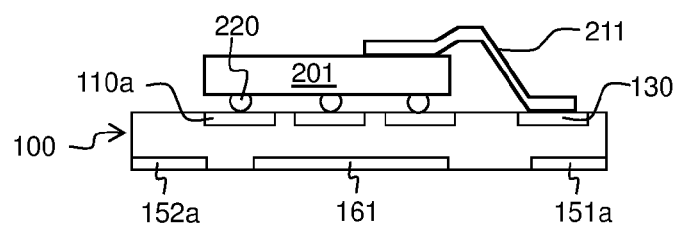

FIG. 2F is a cross-sectional view of the structure along A-A plane in FIG. 2D. The metal clip 211 includes an upper end and a lower end. The upper end is attached to the back metal layer of the first flipped chip 201 through a conductive bonding material. The lower end is attached to the connection pad 130 through the conductive bonding material. A height between the upper end and the lower end of the metal sheet is reduced. The power MOSFET usually includes a gate, a source and a drain. The electrical connection between the first chip 201 and the second chip 202 and the substrate 100 is illustrated in FIG. 1D and FIG. 2C.

In examples of the present disclosure, a first metal pad located on the front side of the first chip 201 is configured as the source S1 of the LS MOSFET. A second metal pad on the front side of the first chip 201 is configured as the gate G1. A third metal layer on the back side of the first chip 201 is configured as the drain. In FIG. 2C, the source S1 of the first chip 201 is overlapped and mounted on the first set of welding discs 110a formed in the first mounting area 110. In one example, the source S1 and the first set of welding discs are connected by solder balls or the other similar metal bumps placed on the source S1 of the first chip 201. The gate G1 of the first chip 201 is overlapped and mounted on the second set of welding disc 110b formed in the first mounting area 110. In one example, the gate G1 and the second set of welding discs are connected by solder balls placed on the gate G1 of the first chip 201. The second chip 202 includes a HS MOSFET and an integrated control circuit module. In FIG. 2C, a plurality of source metal pads S2 of the HS MOSFET located on the front side of the second chip 202 are overlapped and mounted on the fifth sets of welding discs 122a formed in the second mounting area 120. Each source metal pad S2 is attached to a respective welding disc of the fifth set of welding discs 122a. In one example, the attachment is by solder balls or other similar metal bumps. A plurality of drain metal pads D2 of the HS MOSFET located on the front side of the second chip 202 are attached on the sixth set of welding discs 123a formed in the second mounting area 120. Each drain pad D2 is attached to a respective welding disc of the sixth set of welding disc 123a. In one example, the attachment is by solder balls. Because the HS MOSFET and the control circuit in the second chip 202 are integrated on the same chip, the gate of the HS MOSFET in the second chip 202 can be directly coupled to the control circuit in the same chip. Therefore, it is unnecessary to form the gate pad on the HS MOSFET.

As shown in FIG. 2C, the third set of welding disc 121a is electrically connected to one of the first set of welding disc 110a. The third set of welding disc 121b is electrically connected to one of the second set of welding discs 110b. The fourth set of welding discs 124a-124b are connected to a respective pin pad of the pin pads 152a-152d. The fourth set of welding disc 124e is connected to the pin pad 151d. Therefore, metal pads IO1-IO7 of various input or output terminals of the control circuit integrated on the second chip 202 can be arranged on the front side of the second chip 202. The metal pads IO1-IO7 are attached to a respective welding disc of the third set of welding discs 121a-121b and the fourth set of welding discs 124a-124e by a respective solder ball or a respective metal bump.

In FIG. 2C, the source S1 of the LS MOSFET of the first chip 201 is attached to the first set of welding discs 110a. The gate G1 of the LS MOSFET is attached to the second set of welding disc 110b. The first set of welding discs 110a are connected to the first metal welding pad 161 (FIG. 2A) on the back surface of the substrate 100. Therefore, the source S1 of the LS MOSFET is also electrically connected to the first metal welding pad 161 on the back surface of the substrate 100. The drain of the LS MOSFET, i.e., the back metal of the first chip 201 is connected to the connection pad 130 through a metal clip 211. The source S2 of the HS MOSFET integrated in the second chip 202 is electrically connected to the connection pad 130 through the fourth set of welding discs 122a. Therefore, the source S2 of the HS MOSFET and the drain of the LS MOSFET are electrically connected. To electrically connecting the pin pads 151a and 151b on the back surface of the substrate 100 with the connection pad 130, nodes (LX) interconnected by the source S2 of the HS MOSFET and the drain of the LS MOSFET are configured in the pin pads 151a and 151b. The drain D2 of the HS MOSFET integrated in the second chip 202 is connected to the welding disc 141a on the top edge of the substrate 100 through the fifth set of welding discs 123a. The welding disc 141a is connected to one pin pad 151c on the back surface of the substrate 100 so that the power voltage VIN is transmitted to the drain D2 of the HS MOSFET through the pin pad 151C as the drain D2 of the HS MOSFET is electrically connected to one pin pad 151c on the back surface of the substrate 100.

When the control circuit integrated in the second chip 202 controls the on or off of the LS MOSFET, a control signal is sent from the metal pad IO1 to drive the LS MOSFET. As the metal pad IO1 of the control circuit is attached to the third set of welding discs 121b, which is connected to the second set of welding discs 110b through the wiring 101, and the gate G1 of the LS MOSFET is attached to the welding disc 110b, the metal pad IO1 of the control circuit is coupled to the gate G1 of the LS MOSFET through the route. The metal pad IO2 of the control circuit integrated in the second chip 202 is attached to the third set of welding discs 121a, which is further connected to one or a plurality of the first set of welding discs 110a through the wiring 101, and the source S1 of the LS MOSFET is attached to the welding disc 110a and the first set of welding discs 110a is further electrically connected to the first metal welding pad 161 (FIG. 2A) on the back surface of the substrate 100, so the metal pad IO2 of the control circuit is electrically coupled to the first metal welding pad 161 on the back surface of the substrate 100. Each of the metal pads 103-106 of the control circuit are electrically connected to a respective welding disc of the welding discs 142a-142d near the bottom edge of the substrate 100 through the wiring 101. The metal pad IO7 of the control circuit is electrically connected to the welding disc 141b near the top edge of the substrate 100 through the wiring 101. The welding discs 142a-142d on the front surface of the substrate 100 are correspondingly connected to the pin pads 152a-152d on the back surface of the substrate 100. The welding disc 141b on the front surface of the substrate 100 is correspondingly connected to the pin pad 151d on the back surface of the substrate 100. Therefore, the metal pads IO3-IO6 of the control circuit are electrically connected to the pin pads 152a-152d on the back surface of the substrate 100 correspondingly. The metal pad IO7 of the control circuit is electrically connected to the pin pad 151d on the back surface of the substrate 100 correspondingly. The first welding pad 161 (FIG. 2A) with a larger size is arranged on the back surface of the substrate 100 improving the heat dissipation generated in the HS MOSFET and the LS MOSFET. In examples of the present disclosure, the first metal welding pad 161 serves as the GND pin (the source S1 of the LS MOSFET) and also improves the heat dissipation of the device.

Figure 2G:
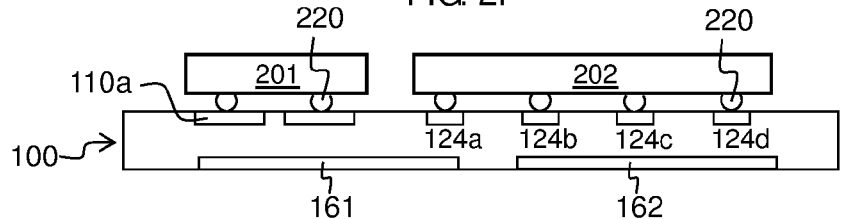
Figure 2H:
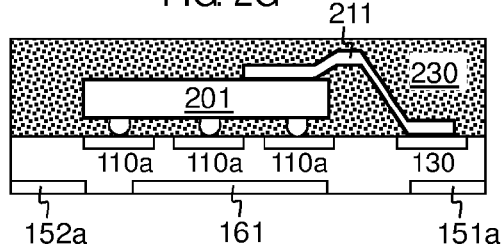
Figure 2I:
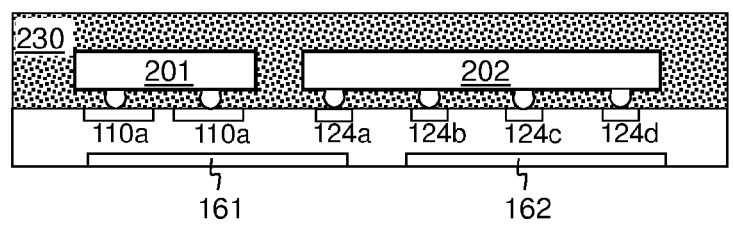

FIG. 2F and FIG. 2G are cross sectional view of the structure in FIG. 2D along the dotted lines AA and BB respectively. The first chip 201 is flipped and mounted on the welding discs 110a and 110b through solder balls 220 placed on the source S1 and the gate G1 of the LS MOSFET. The HS MOSFET integrated in the second chip 202 is flipped and attached on the fifth and sixth sets of welding discs through the solder balls 220 placed on the source S2 and the drain D2 of the HS MOSFET. The metal pads IO1-IO7, as the terminals of the control circuit, integrated in the second chip 202 are mounted on the third and fourth sets of welding discs through the solder balls 220. After the first and second chips 201 and 202 are attached to the substrate 100, a molding layer 230 is formed to cover the first chip 201, the second chip 202 and the metal clip 211 as shown in FIG. 2H and FIG. 2I.

In FIG. 2A and FIG. 2C, a second metal welding pad 162 is arranged in the center area on the back surface of the substrate 100, and the plurality of fifth set of welding discs 122a are aligned with and overlapped with the second metal welding pad 162 with a through hole filled with an interconnecting via 102 penetrating through the welding discs 122a and the second metal welding pad 162. Therefore, the second metal welding pad 162 is connected to the fifth set of welding discs 122a and is further connected to the source S2 of the HS MOSFET and the drain D1 of the LS MOSFET. As a result, the second metal welding pad 162 serves as the LX pin (the drain D1 of the LS MOSFET and the source S2 of the HS MOSFET) and can also improve the heat dissipation of the device.

Figure 3A:
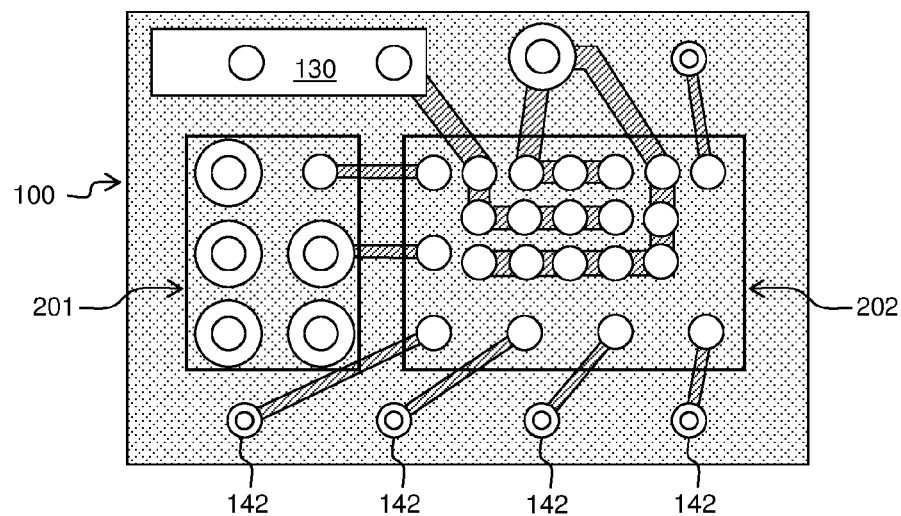
FIG. 3A to FIG. 3C are schematic diagrams of metal welding pads with larger heat dissipation areas on a back surface of the circuit board.
Figure 3B:
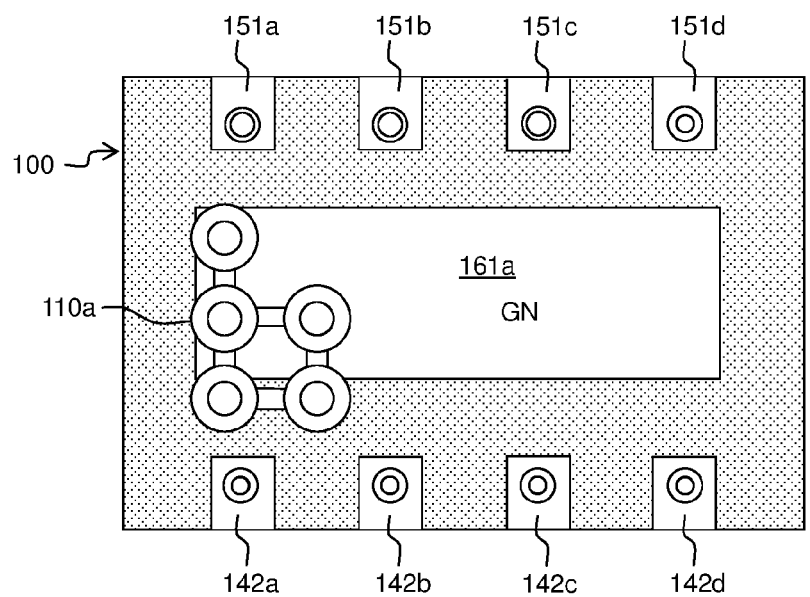
Figure 3C:
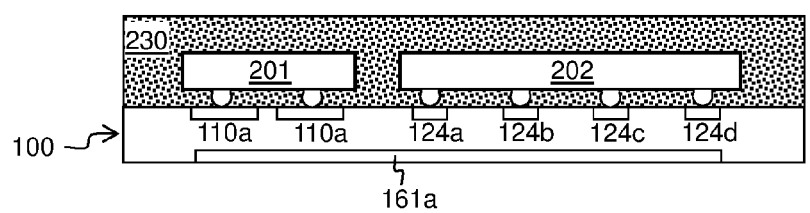

FIG. 3A to FIG. 3C is similar to FIG. 2A to FIG. 2I except that only one metal welding pad 161a is formed in the center area of the back surface of the substrate 100. In FIG. 3A to FIG. 3C, the first metal welding pad 161a is larger and is arranged in the entire center area of the back surface of the substrate 100. The first metal welding pad 161a occupies all the area of the first and second metal welding pads 161 and 162 of FIG. 2A.

Figure 4A:
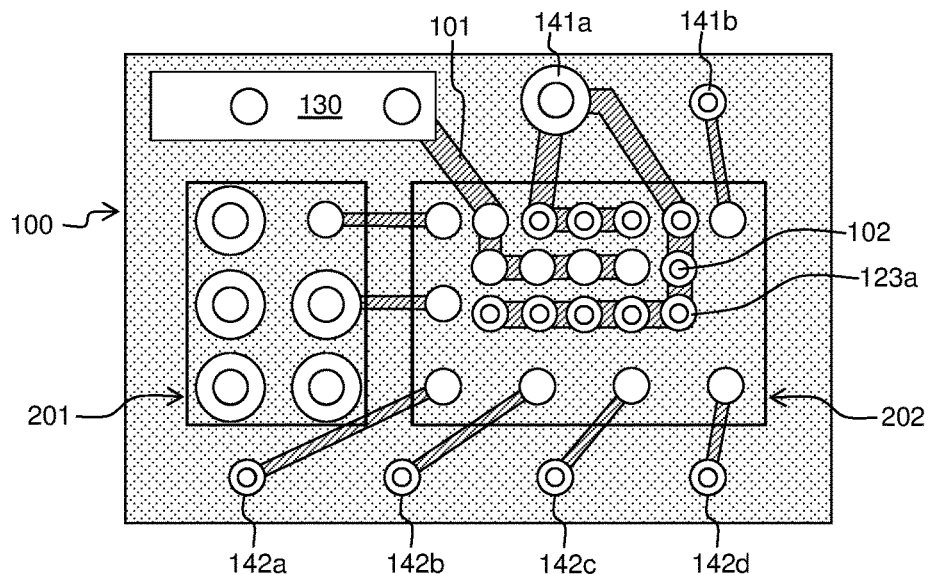
FIG. 4A to FIG. 4C are schematic diagrams of the metal welding pads for heat dissipation on the back surface of the circuit board.
Figure 4B:
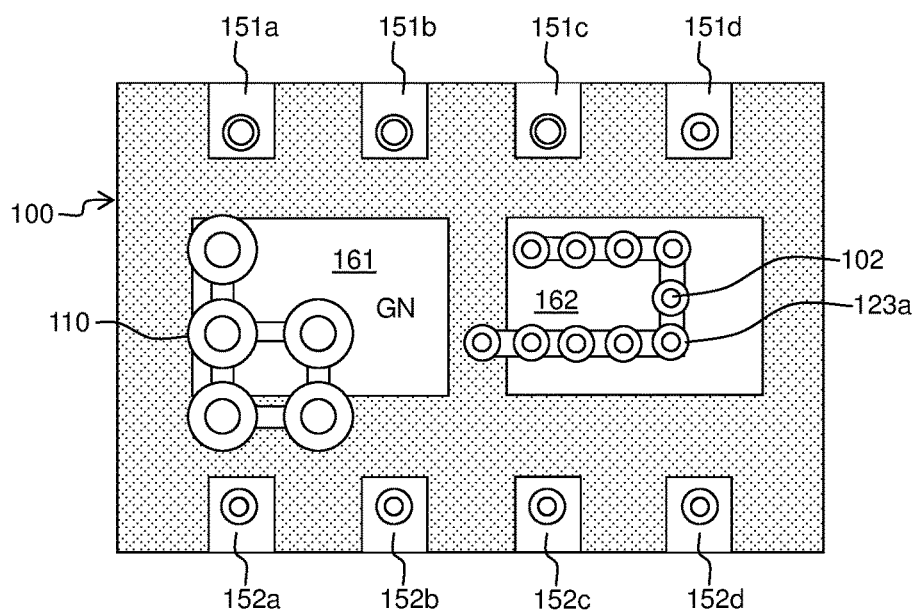
Figure 4C:
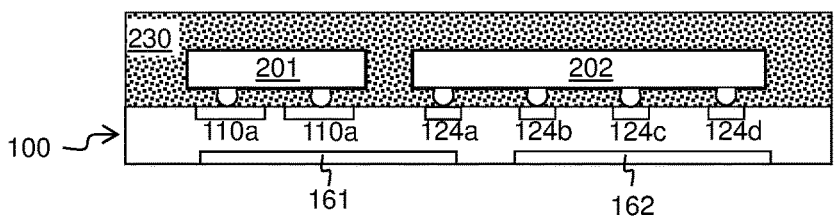

FIG. 4A to FIG. 4C is similar to FIG. 2A to FIG. 2I. In FIG. 2A, the fifth set of welding discs 122a are connected to the second metal welding pad 162 through the interconnecting via 102. In FIG. 4B, the sixth set of welding discs 123a are aligned with and overlapped with the second metal welding pad 162 instead of the fifth set of welding discs 122a. therefore, the sixth set of welding discs 123a and the second metal welding pad 162 are electrically connected together by the interconnecting via 102 formed in the through hole penetrating through the substrate 100. In FIG. 4B, the drain D2 of the HS MOSFET integrated in the second chip 202 is electrically connected to the sixth set of welding discs 123a through the wiring 101. Therefore, the second metal welding pad 162 is also connected to the drain D2 of the HS MOSFET. Furthermore, the power voltage VIN is an input from the pin pad 151c electrically connected to the drain D2 of the HS MOSFET. Therefore, the second metal welding pad 162 can be an input terminal for inputting the power voltage VIN and with larger area. It also improves heat dissipation of the device.

Figure 5A:
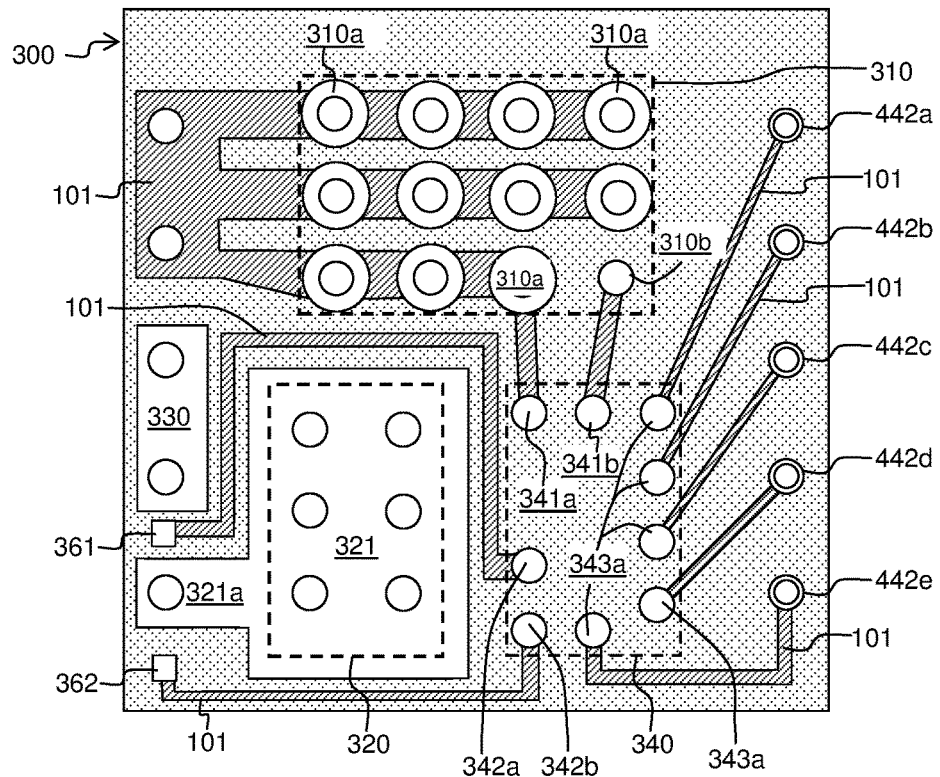
FIG. 5A to FIG. 5F are schematic diagrams illustrating a process of mounting three separated chips on a front surface of the circuit board in examples of the present disclosure.
Figure 5B:
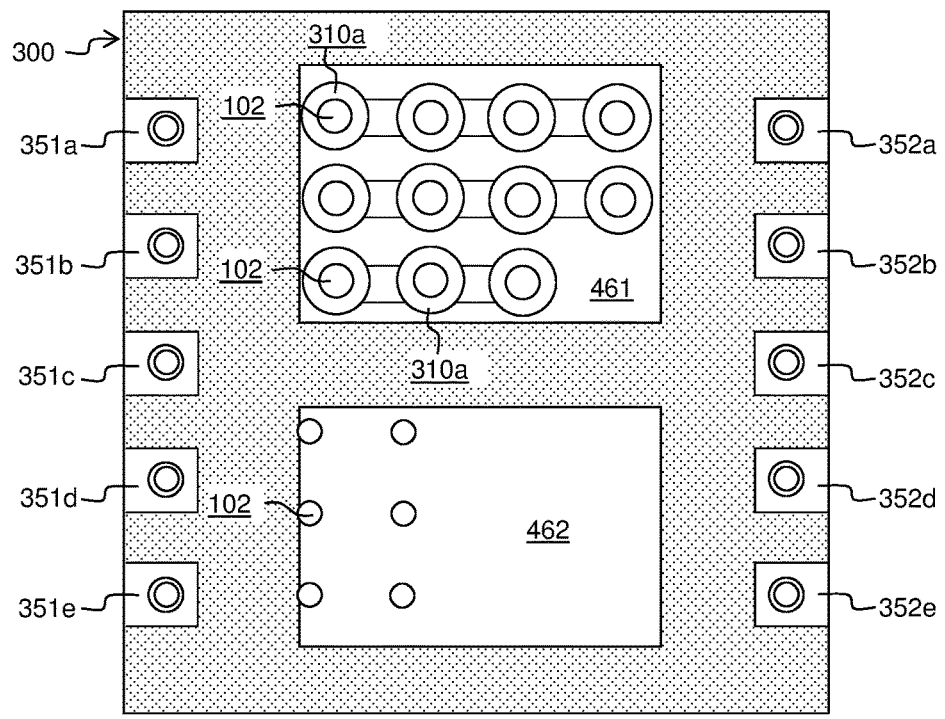

In FIG. 5A and FIG. 5B, the front surface of the substrate 300 includes a first mounting area 310, a second mounting area 340, a third mounting area 320 and a connection pad 330. The back surface of the substrate 300 includes a first metal welding pad 461. In FIG. 5B, a plurality of pin pads are arranged on the back surface of the substrate 100 with a row of the first group of pin pads 351a-351e arranged near the first edge of the square substrate 100. A row of the second group of pin pads 352a-352e are arranged near the second edge opposite the first edge of the square substrate 100. In FIG. 5A, the second mounting area 340 and the third mounting area 320 are arranged side by side in one half of the area of the substrate 100. The first mounting area 310 is located on the other half of the substrate. Therefore, the first mounting area 310, the second mounting area 340 and the third mounting area 320 are in a compact T shape to reduce a required area of the circuit board.

FIG. 5A is a schematic diagram of the insulating substrate 300 or the printed circuit board, the first mounting area 310, the second mounting area 340 and the third mounting area 320. The front surface of the substrate 300 are mainly used for mounting three different semiconductor chips. The first mounting area 310 includes the first set of welding discs 310a and the second set of welding discs 310b. The first set of welding discs includes a plurality of welding discs 310a. In examples of the present disclosure, the second set only includes one welding disc 310b. The number of welding discs in the first set or second set may vary. The second mounting area 340 includes the third set of welding discs 341a-341b, the fourth set of welding discs 343a, the fifth set of welding discs 342a and the sixth set of welding discs 342b.

In FIG. 5A, the second set of welding disc 310b in the first mounting area 310 are directly interconnected with a third set of welding disc 341b in the second mounting area 340 through the metal wiring 101. A first set of welding disc 310a in the first mounting area 310 is directly interconnected with a third set of welding disc 341a in the second mounting area 340 through the metal wiring 101.

In FIG. 5A, each of the fourth set of welding disc 343a is connected to a respective pin pad through the wiring 101. Specifically, one fourth set of welding disc 343a is connected to one welding disc 442a located on the front surface of the substrate 300, which is essentially aligned with and is overlapped with the pin pad 352a (FIG. 5B) on the back surface of the substrate 300. A through hole penetrating through the thickness of the substrate 300 between the welding disc 442a on the front surface and the pin pad 352a on the back surface is filled with a metal material so as to form an interconnecting via 102 electrically connecting the welding disc 442a on the front surface and the pin pad 352a on the back surface of the substrate 300. Therefore, the fourth set of welding disc 343a is electrically connected to the pin pad 352a. Similarly, another fourth set of welding disc 343a is connected to a welding disc 442b located on the front surface of the substrate 300, which is aligned with and is electrically connected to the pin pad 352b (FIG. 1B) by the interconnecting via 102. The other fourth set of welding disc 343a is connected to one welding disc 442c located on the front surface of the substrate 300, which is aligned with and is electrically connected to the pin pad 352c (FIG. 1B) by the interconnecting via 102. Similarly, one fourth set of welding disc 343a is connected to one welding disc 442d on the front surface of the substrate 300 through the wiring 101, which is aligned with and is electrically connected to the pin pad 352c. Therefore, the welding disc 343a is electrically connected to the pin pad 352d. A fourth set of welding disc 343a is connected to one welding disc 442e on the front surface of the substrate 300 through the wiring 101, which is aligned with and is electrically connected with the pin pad 352e. Therefore, the welding disc 343a is electrically connected with the pin pad 352e.

In FIG. 5A, the fifth set of welding disc 342a is electrically connected with a bonding pad 361 through the wiring 101 on the front surface of the substrate 300. The sixth set of welding disc 342b is electrically connected with the other bonding pad 362 through the wiring 101 on the front surface of the substrate 300. The bonding pad 361 and the bonding pad 362 are preferably located near the first edge of the substrate 300. One metal die pad 321 with a long and thin metal portion 321a extending to the first edge of the substrate 300 is formed in the third mounting area 320. The connection pad 330 is arranged between the third mounting area 320 and the first edge of the substrate 300. The connection pad 330 is overlapped with the first row of pin pad 351c-351d (FIG. 5B) and is connected to the pin pads 351c and 351d by interconnecting vias 102 formed in the through holes penetrating the substrate 300 between the pin pads 351c-351d and the connection pad 330. The wirings 101 interconnected with the first set of welding discs 310a on the front surface of the substrate 300 are extending near the first edge of the substrate 300 to overlap with the pin pads 351a-351b (FIG. 5B). Therefore, the wirings 101 are electrically connected to the pin pads 351a-351b by the interconnecting vias 102 formed in the through holes penetrating through the substrate 300 between these wirings 101 and the pin pads 351a-351b. The extended metal portion 321a of the metal die pad 321 is overlapped with the pin pad 351e in the first row (FIG. 5B). Therefore, the extended metal portion 321a is electrically connected to the pin pad 351e by interconnecting via 102 formed in the through hole penetrating the substrate 300 between the metal portion 321a and the pin pad 351e. The metal die pad 321 is also connected to the pin pad 351e.

In FIG. 5B, the first row of pin pads 351a-351e and the second row of pin pads 352a-352e are located at the back surface near the first and second edges of the substrate 300. A first metal welding pad 461 is attached in the center area at the back surface of the substrate 300. Optionally, a second metal welding pad 462 is attached in the center area at the back surface of the substrate 300. The second metal welding pad 462 is arranged side by side with the first metal welding pad 461. The first set of welding discs 310a formed in the first mounting area 310 on the front surface of the substrate 300 are aligned with and are overlapped with the first metal welding pad 461 on the back surface of the substrate 300. Therefore, the welding discs 310a and the first metal welding pad 461 are electrically connected by the interconnecting vias 102 formed in the through holes penetrating through the substrate 300 between the welding discs 310a and the first metal welding pad 461. However, the second set of welding disc 310b formed in the first mounting area 310 is not electrically connected to the first metal welding pad 461. In examples of the present disclosure, when the second metal welding pad 462 is formed on the back surface of the substrate 300, it is separated from the first metal welding pad 461.

In FIG. 5A to FIG. 5B, the metal die pad 321 located in the third mounting area 320 is overlapped with at least a portion of the second metal welding pad 462 on the back surface of the substrate 300. Therefore, the metal die pad 321 is electrically interconnected with the second metal welding pad 462 by an interconnecting via 102 formed in the through hole penetrating through the substrate 300 between the metal die pad 321 and the second metal welding pad 462.

Figure 5C:
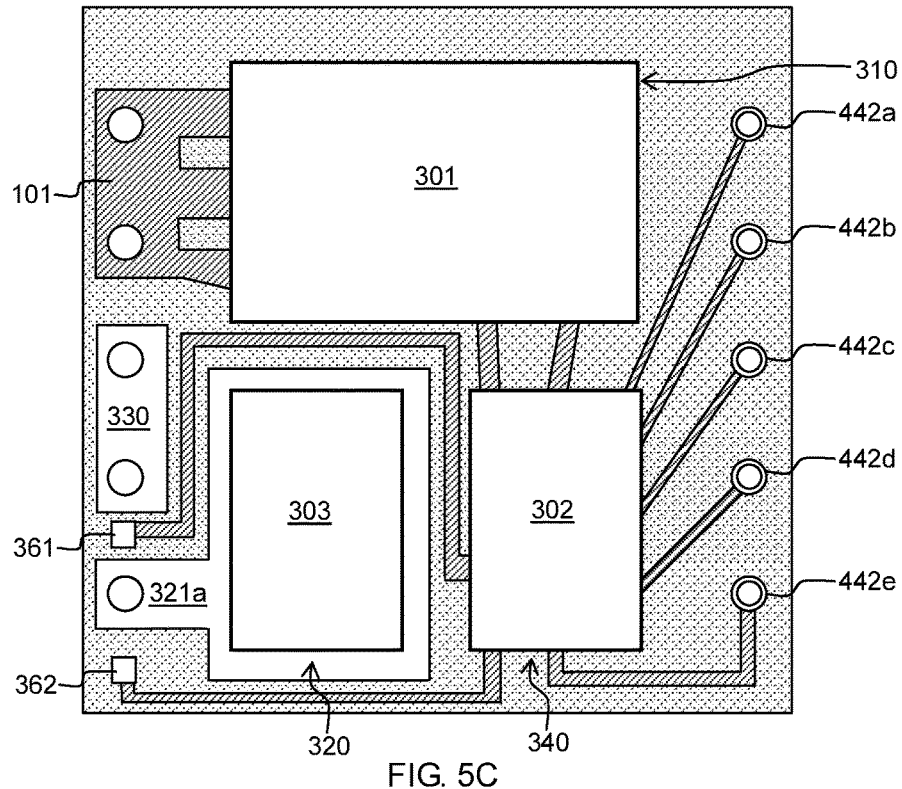

In FIG. 5C, the first semiconductor chip 301 is flipped and mounted on the first mounting area 310. A second semiconductor chip 302 is flipped and mounted on the second mounting area 340. A third semiconductor chip 303 is mounted on the third mounting area 320 without flipping. For clarity, the first chip 301, the second chip 302 and the third chip 303 are drawn as transparent in FIG. 5D to show the position alignment mode of three chips in the first mounting area 310, the second mounting area 340 and the third mounting area 320 respectively. As mentioned above, in a conventional DC-DC voltage converter, a LS power MOSFET and a HS power MOSFET are usually connected between a power voltage VIN and a ground terminal GND in serial. A control circuit controls the on-off of the HS power MOSFET and the HS power MOSFET. In one example, the first chip 301 is the LS power MOSFET, the second chip 302 is the control circuit, and the third chip 303 is the HS power MOSFET.

Figure 5D:
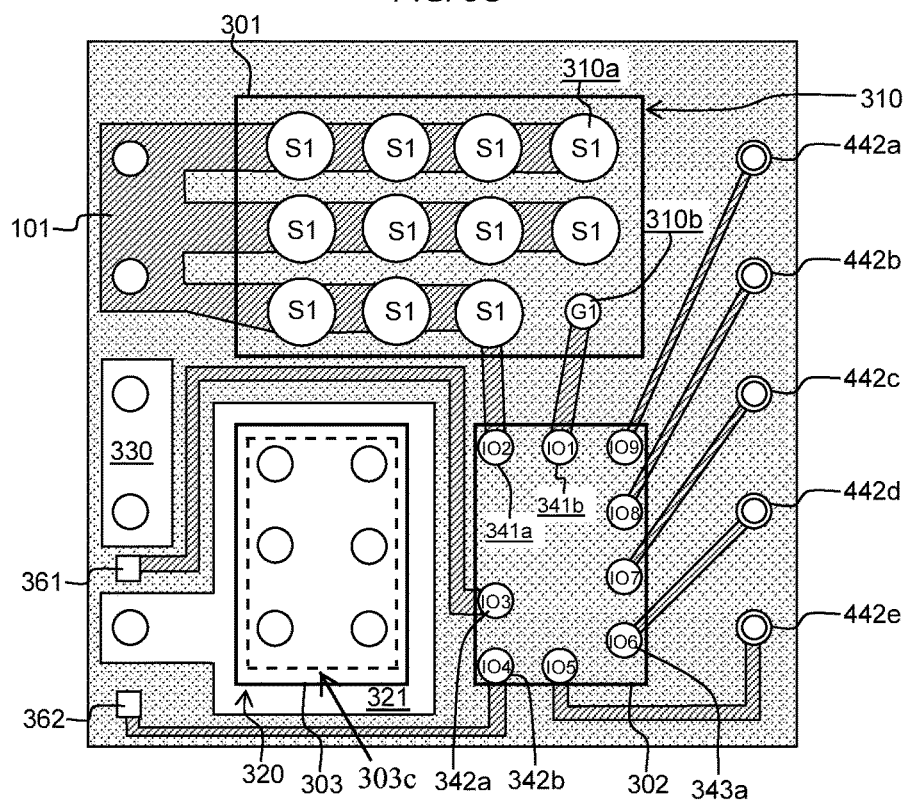
Figure 5E:
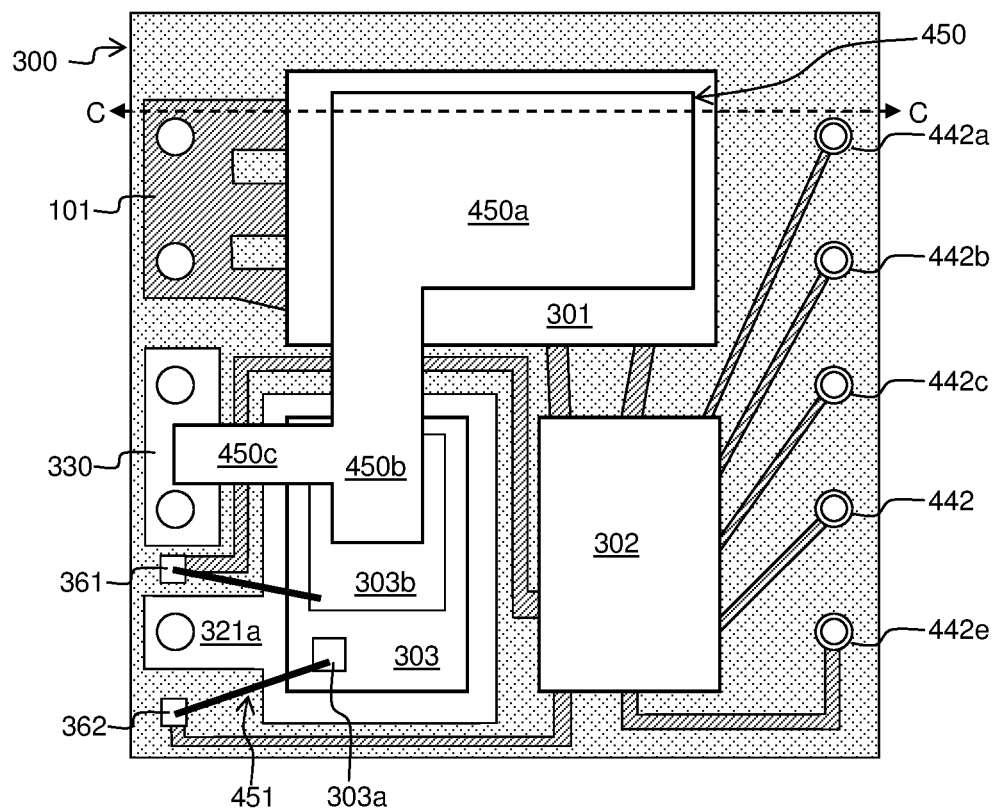

In FIG. 5E, a metal clip 450 is mounted on the first chip 301 and the third chip 303. The metal clip 450 is essentially an L-shape metal sheet. The metal clip 450 includes a first portion 450a and a second portion 450b perpendicular to the first portion 450a. The first portion 450a is attached to the back metal layer of the flipped first chip 301 through a conductive material. The second portion 450b is attached to a source metal pad 303b on the front side of the third chip 303. An extending portion 450c extends away from the second portion 450b. The free end of the extending portion 450c is directly attached to the connection pad 330 through the conductive material. The extending portion 450c extends in an opposite direction to the first portion 450a. The first portion 450a and the second portion 450b are coplanar. Therefore, a height from the free end of the extending portion 450c attached on the connection pad 330 to the first portion 450a and the second portion 450b is small. The connection pad 330 is electrically connected to the source metal pad 303b on the front side of the third chip 303 and the drain metal layer on the back side of the first chip 301 through the metal clip 450. The power MOSFET usually includes a gate, source and drain. The electrical connection between the first chip 301 and the third chip 303 as well as the substrate 300 is illustrated in FIG. 5D and FIG. 5E.

In examples of the present disclosure, a metal pad located on the front side of the first chip 301 is configured as the source S1 of the LS MOSFET. Another pad is configured as the gate G1. The metal layer on the back side of the first chip 301 is configured as the drain. In FIG. 5D, when the first chip 301 is flipped and attached to the first mounting area 310, the source S1 of the first chip 301 is attached to the first set of welding discs 310a through a solder ball or other metal bump. The gate G1 of the first chip 301 is attached to the second set of welding discs 310b through the solder ball or the other metal bump.

As mentioned above in FIG. 5D, the third set of welding disc 341a is electrically connected to one first set of welding disc 310a. The other third set of welding disc 341b is electrically connected to the second set of welding disc 310b. In FIG. 5A and FIG. 5D, the metal pads IO1-IO9 of various input or output (I/O) terminals of the control circuit integrated in the second chip 302 can also be arranged on the front side of the second chip 302. The metal pads IO1-IO9 need to be connected to the third to sixth sets of welding discs. Specifically, each of the fourth set of welding discs 343a (FIG. 5A) is connected to a respective pin pad of the pin pads 352a-352e (FIG. 5B). In one example in FIG. 5D, one welding disc 343a (attached to the IO9) is connected to one welding disc 442a overlapped with the pin pad 352a on the front surface of the substrate 300. The welding disc 442a is connected to the pin pad 352a. Therefore, the welding disc 343a attached to the IO9 is connected with the pin pad 352a. Similarly, one welding disc 343a (attached to the IO8) is connected to one welding disc 442b overlapped with the pin pad 352b on the front surface of the substrate 300 through the wiring 101. The welding disc 442b is connected with the pin pad 352b. Therefore, the welding disc 343a attached to the IO8 is connected with the pin pad 352b. One welding disc 343a attached to the IO7 is connected with pin pad 352c. The welding disc 343a attached to the IO6 is connected with the pin pad 352d. The welding disc 343a welded with the 106 is connected with the pin pad 352e.

In FIG. 5D, one metal pad IO1 of the control circuit integrated in the second chip 302 is attached to the third set of welding disc 341b through the solder ball or other metal bump. The welding disc 341b is further connected to the second set of welding disc 310b through the wiring 101. Therefore, a driving signal sent by the control circuit integrated in the second chip 302 can be transmitted to the second set of welding disc 310b through the welding disc 341b and then to the gate G1 of the LS MOSFET. A metal pad IO2 of the control circuit integrated in the second chip 302 is attached to the third set of welding disc 341a through the solder ball or the other metal bump. The welding disc 341a is further connected to the first set of welding discs 310a. The terminal IO2 of the control circuit integrated in the second chip 302 and the first set of welding discs 310a are connected to the first metal welding pad 461 (FIG. 5B). The fifth set of welding disc 342a (attached to the IO3) in FIG. 5D is connected to one bonding pad 361 on the front surface of the substrate 300 through the wiring 101. One sixth set of welding disc 342b (attached to the IO4) in FIG. 5D is connected to one bonding pad 362 on the front surface of the substrate 300 through the wiring 101.

In FIG. 5D and FIG. 5E, the source S1 of the LS MOSFET of the first chip 201 is attached to the first set of welding discs 310a. The gate G1 of the LS MOSFET is attached to the second set of welding disc 310b. The first set of welding discs 310a is connected to the first metal welding pad 461 (FIG. 5B) on the back surface of the substrate 300. The source S1 of the LS MOSFET is also electrically connected to the first metal welding pad 461 on the back surface of the substrate 300. The drain of the LS MOSFET, i.e., the back metal layer of the first chip 301 is connected to the source metal pad 303b of the third chip 303 through the metal clip 450. The extending portion 450c of the metal clip 450 is attached to the connection pad 330b. Therefore, the node (LX) interconnecting the drain D1 of the LS MOSFET with the source S2 of the HS MOSFET is reflected in the connection pad 330 as well as the pin pad 351c and the pinpad 351d. The source S1 of the LS MOSFET is reflected in the pin pad 351a and the pin pad 351b that are connected to the source S1. The back metal layer 303c (shown in dashed lines) of the HS MOSFET in the third chip 303, i.e., the drain D2, is attached to the metal die pad 321 in the third mounting area 320 through the conductive bonding material. The metal die pad 321 and the metal portion 321a are connected to the pin pad 351e through the interconnecting via 102. A power voltage VIN can be applied to the drain D2 of the HS MOSFET through the pin pad 351e as the drain D2 of the HS MOSFET is electrically connected to one pin pad 351e on the back surface of the substrate 300.

In FIG. 5B, the metal die pad 321 is further connected with the second metal welding pad 462 on the back surface of the substrate 300 through the interconnecting vias 102. Therefore, the second metal welding pad 462 is served as the grounding VIN pin. It improves the heat dissipation. Furthermore, the first metal welding pad 461 is served as the grounding GND pin (connected to the source S1 of the LS MOSFET) and also improves the heat dissipation of the device.

In FIG. 5D and FIG. 5E, the fifth set of welding disc 342a are electrically connected to one bonding pad 361 through the wiring 101 on the front surface of the substrate 300. The sixth set of welding disc 342b are electrically connected to the other bonding pad 362 through the wiring 101 on the front surface of the substrate 300. Before or after mounting the metal clip 450, a bond wire 451 is used to connect one bonding pad 362 to one source metal pad 303b on the front side of the third chip 303. A bond wire 451 is also used to connect between one bonding pad 362 and one gate metal pad 303a on the front side of the third chip 303. The fifth set of welding disc 342a (attached to the IO3) in FIG. 5D is connected to the source metal pad 303b of the HS MOSFET. The sixth set of welding disc 342a (attached to the IO4) in FIG. 5D is connected to the gate metal pad 303a of the HS MOSFET. Therefore, the control circuit integrated in the second chip 302 can drive the HS MOSFET on-off through the route of the sixth set of welding disc 342b and the bonding pad 362, and sense the potential change of the source metal pad 303b through the fifth set of welding disc 342a and the bonding pad 361.

Figure 5F:
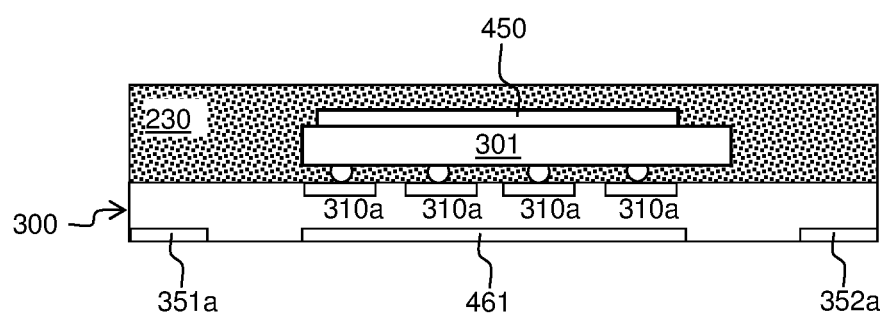
Figure 6:
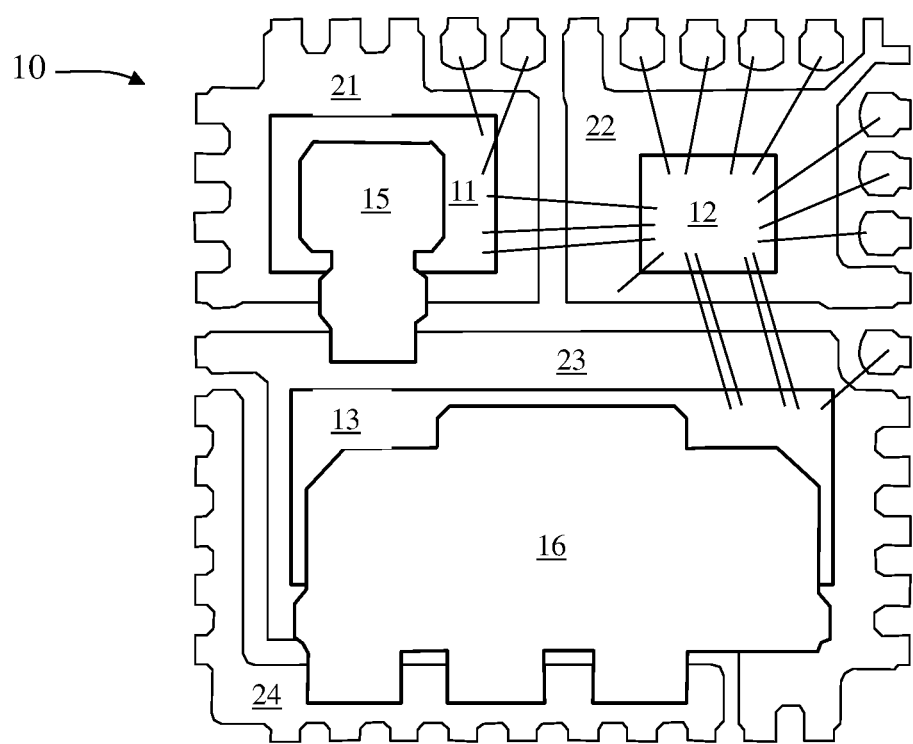
FIG. 6 is a schematic diagram of a conventional DC-DC converter.

FIG. 5F is a cross sectional view of the device in FIG. 5E along the dotted line C-C. After the installation of the chips, a molding layer 230 is formed to cover the first chip 301, the second chip 302, the third chip 303, the metal clip 450 and the bond wires 451.

Those of ordinary skill in the art may recognize that modifications of the embodiments disclosed herein are possible. For example, the number of welding discs in the first and second mounting areas may vary. Other modifications may occur to those of ordinary skill in this art, and all such modifications are deemed to fall within the purview of the present invention, as defined by the claims.

The invention claimed is:

1. A metal oxide semiconductor field-effect transistor (MOSFET) based DC-DC voltage converter comprising:
    a substrate comprising
        a first mounting area and a second mounting area on a front surface of the substrate;
        wherein a connection pad is arranged on the front surface of the substrate;
        wherein a first metal welding pad and a plurality of pin pads are arranged on a back surface of the substrate;
        wherein a first group of wirings and a second group of wirings are arranged on the substrate; and
        wherein a first group of interconnecting vias and a second group of interconnecting vias are through the substrate;
    a first group of welding discs distributed on the first mounting area and a second group of welding discs distributed on the second mounting area, a portion of the first group of welding discs and a portion of the second group of welding discs being connected through the first group of wirings;
        wherein the first group of welding discs are connected to the first metal welding pad through the first group of interconnecting vias, and
        wherein the second group of welding discs are connected to the plurality of pin pads through the second group of wirings and the second group of interconnecting vias;
    a first chip flipped and attached to the first mounting area;

wherein metal pads on a front side of the first chip are attached to the first group of welding discs distributed on the first mounting area;

a second chip flipped and attached to the second mounting area;

wherein metal pads on a front side of the second chip are attached to the second group of welding discs distributed on the second mounting area;

a metal clip connecting the connection pad to a metal layer on a back side of the first chip, and a molding body enclosing the front surface of the substrate, the first chip, the second chip and the metal clip.

2. The MOSFET-based DC-DC voltage converter of claim 1, wherein the first group of welding discs comprises a first set and a second set of welding discs;

wherein the second group of welding discs comprises a third set, a fourth set, a fifth set, and a sixth set of welding discs;

wherein a portion of the third set of welding discs are electrically connected to one or more welding discs of the first set of welding discs;

wherein another portion of the third set of welding discs are electrically connected to one or more welding discs of the second set of welding discs;

wherein one or more welding discs of the fourth set of welding discs are each electrically connected to a respective pin pad of the plurality of pin pads through a portion of the second group of wirings and a portion of the second group of interconnecting vias;

wherein each welding disc of the fifth set of welding discs is electrically connected to the connection pad;

wherein the connection pad is electrically connected to one or more pin pads of the plurality of pin pads through another portion of the second group of the interconnecting vias; and wherein each welding disc in the sixth set of welding discs is electrically connected to a respective pin pad of the plurality of pin pads.

3. The MOSFET-based DC-DC voltage converter of claim 2, wherein a second metal welding pad is arranged on the back surface of the substrate; and wherein one or more welding discs in the fifth set of welding discs are connected to the second metal welding pad through still another portion of the second group of interconnecting vias.

4. The MOSFET-based DC-DC voltage converter of claim 2, wherein a second metal welding pad is arranged on the back surface of the substrate; and wherein one or more welding discs in the sixth set of welding discs are connected to the second metal welding pad through still another portion of the second group of interconnecting vias.

5. The MOSFET-based DC-DC voltage converter of claim 2, wherein a first metal pad of the metal pads on the front side of the first chip is welded to one or more welding discs of the first set of welding discs; and wherein a second metal pad of the metal pads on the front side of the first chip is welded to one or more welding discs of the second set of welding discs.

6. The MOSFET-based DC-DC voltage converter of claim 5, wherein one or more third metal pads of the metal pads on the front side of the second chip are welded to one or more welding discs of the fifth set of welding discs;

wherein one or more fourth metal pads of the metal pads on the front side of the second chip are welded to one or more welding discs of the sixth set of welding discs; and wherein a plurality of fifth metal pads of the metal pads on the front side of the second chip are welded to the welding discs of the third set of welding discs and the fourth set of welding discs.

7. The MOSFET-based DC-DC voltage converter of claim 6, wherein the first chip comprises a first MOSFET;

wherein the first metal pad of the metal pads on the front side of the first chip is a gate of the first MOSFET;

wherein the second metal pad of the metal pads on the front side of the first chip is a source of the first MOSFET; and wherein the metal layer on the back side of the first chip is a drain of the first MOSFET.

8. The MOSFET-based DC-DC voltage converter of claim 6, wherein the second chip is integrated with a control circuit and a second MOSFET;

wherein the one or more third metal pads are a source of the second MOSFET;

wherein the one or more fourth metal pads are a drain of the second MOSFET; and wherein the plurality of fifth metal pads are input or output terminals of the control circuit.

9. A metal oxide semiconductor field-effect transistor (MOSFET) based DC-DC voltage converter comprising:

a substrate comprising
a first mounting area, a second mounting area and a third mounting area on a front surface of the substrate;
wherein a connection pad is arranged on the front surface of the substrate;
wherein a first metal welding pad and a plurality of pin pads are arranged on a back surface of the substrate;
wherein a first group of wirings and a second group of wirings are arranged on the substrate; and
wherein a first group of interconnecting vias and a second group of interconnecting vias are through the substrate;

a first group of welding discs distributed on the first mounting area and a second group of welding discs distributed on the second mounting area, a portion of the first group of welding discs and a portion of the second group of welding discs being connected through the first group of wirings;
wherein the first group of welding discs are connected to the first metal welding pad through the first group of interconnecting vias;
wherein a first portion of the second group of welding discs are connected to the plurality of pin pads through the second group of wirings and the second group of interconnecting via; and
wherein a second portion of the second group of welding discs is connected to a plurality of bonding pads;

a first chip flipped and attached to the first mounting area;
wherein metal pads on a front side of the first chip are attached to the first group of welding discs distributed on the first mounting area;

a second chip flipped and attached to the second mounting area;
wherein metal pads on a front side of the second chip are attached to the second group of welding discs distributed on the second mounting area;

a third chip mounted in the third mounting area;
wherein a metal layer on a back side of the third chip is attached to a die pad located in the third mounting area;

a metal connection connecting a back metal layer of the first chip to a metal pad on a front side of the third chip and the connection pad;

a bond wire connecting a bonding pad of the plurality of bonding pads to a metal pad on the front side of the third chip; and a molding body enclosing the front surface of the substrate, the first chip, the second chip, the third chip, the metal connection and the bond wire.

10. The MOSFET-based DC-DC voltage converter of claim 9, wherein the first group of welding discs comprises a first set and a second set of welding discs;

wherein the second group of welding discs comprises a third set, a fourth set, a fifth set, and a sixth set of welding discs;

wherein a portion of the third set of welding discs are electrically connected to one or more welding discs of the first set of welding discs;

wherein another portion of the third set of welding discs are electrically connected to one or more welding discs of the second set of welding discs;

wherein one or more welding discs of the fourth set of welding discs are each electrically connected to a respective pin pad of the plurality of pin pads through a portion of the second group of wirings and a first portion of the second group of interconnecting vias;

wherein welding discs of the fifth set of welding discs and the sixth set of welding discs are electrically connected to the plurality of bonding pads; and wherein the connection pad and the die pad are electrically connected to one or more pin pads of the plurality of pin pads.

11. The MOSFET-based DC-DC voltage converter of claim 10, wherein one or more welding discs of the first set of welding discs are connected to the first metal welding pad through the interconnecting vias.

12. The MOSFET-based DC-DC voltage converter of claim 10, wherein a second metal welding pad is arranged on the back surface of the substrate and wherein the die pad is connected to the second metal welding pad through a second portion of the second group of interconnecting vias.

13. The MOSFET-based DC-DC voltage converter of claim 10, wherein a first metal pad of the metal pads on the front side of the first chip is welded to one or more welding discs of the first set of welding discs; and wherein a second metal pad of the metal pads on the front side of the first chip is welded to one or more welding discs of the second set of welding discs.

14. The MOSFET-based DC-DC voltage converter of claim 13, wherein a third metal pad on the front side of the third chip is electrically connected to the back metal layer of the first chip and the connection pad through a metal clip; wherein the third metal pad is further connected to a first bonding pad of the plurality of bonding pads through a first bond wire; and wherein a fourth metal pad on the front side of the third chip is connected to a second bonding pad of the plurality of bonding pads through a second bond wire.

15. The MOSFET-based DC-DC voltage converter of claim 14, wherein a plurality of fifth metal pads of the metal pads on the front side of the second chip are welded to welding discs of the third set, the fourth set, the fifth set, and the sixth set of welding discs.

16. The MOSFET-based DC-DC voltage converter of claim 15, wherein the first chip comprises a first MOSFET;

wherein the first metal pad of the metal pads on the front side of the first chip is a gate of the first MOSFET;

wherein the second metal pad of the metal pads on the front side of the first chip is a source of the first MOSFET; and wherein the metal layer on the back side of the first chip is a drain of the first MOSFET.

17. The MOSFET-based DC-DC voltage converter of claim 15, wherein the third chip comprises a second MOSFET;

wherein the third metal pad is a source of the second MOSFET;

wherein the fourth metal pad is a gate of the second MOSFET; and wherein the metal layer on the back side of the third chip is a drain of the second MOSFET.

18. The MOSFET-based DC-DC voltage converter of claim 9, wherein the second mounting area and the third mounting area are arranged side by side and are located on a lower half of the substrate;

wherein the first mounting area is located on an upper half of the substrate; and wherein the first mounting area, the second mounting area and the third mounting area are arranged in a shape of a triangle.

19. The MOSFET-based DC-DC voltage converter of claim 18, wherein a metal clip comprises an L-shape metal sheet connecting the first chip and the third chip;

wherein the L-shape metal sheet comprises a first portion attached to the first chip and a second portion attached to the third chip; and wherein the second portion comprises an extending portion attached to the connection pad.

\* \* \* \* \*